United States Patent

Miyamoto et al.

[11] Patent Number: 5,951,879
[45] Date of Patent: Sep. 14, 1999

[54] METHOD OF ETCHING POLYSILICON LAYER

[75] Inventors: Kyoko Miyamoto, Kyoto; Satoshi Nakagawa, Toyama, both of Japan

[73] Assignee: Matsushita Electronics Corporation, Osaka, Japan

[21] Appl. No.: 08/631,003

[22] Filed: Apr. 12, 1996

[30] Foreign Application Priority Data

Apr. 14, 1995 [JP] Japan .................................... 7-088931

[51] Int. Cl.$^6$ .................................................. H01L 2/302
[52] U.S. Cl. .......................... 216/2; 216/67; 438/710; 438/719
[58] Field of Search .................. 216/2, 67; 438/710, 438/719, 714, 715

[56] References Cited

U.S. PATENT DOCUMENTS

| | | | |
|---|---|---|---|
| 4,341,009 | 7/1982 | Bartholomew et al. | 438/564 |
| 5,362,361 | 11/1994 | Tatsumi | 216/67 |
| 5,560,804 | 10/1996 | Higuchi et al. | 438/719 |
| 5,645,683 | 7/1997 | Miyamoto | 438/714 |

FOREIGN PATENT DOCUMENTS 2-292823  12/1990  Japan .

*Primary Examiner*—Marion McCarmish
*Assistant Examiner*—Laura Weiner
*Attorney, Agent, or Firm*—McDermott, Will & Emery

[57] ABSTRACT

A highly reliable semiconductor IC circuit can be produced by this etching method: A resist layer is formed on a polysilicon layer which is formed on a silicon dioxide layer on a silicon substrate. The resist layer is used as a mask, and silicon oxide layer deposits thereon while polysilicon layer is being etched. Carbon emission out of the resist layer is thus restrained, and thereby a selectivity, an etching speed ratio of polysilicon layer vs. silicon dioxide layer, is substantially raised.

10 Claims, 5 Drawing Sheets

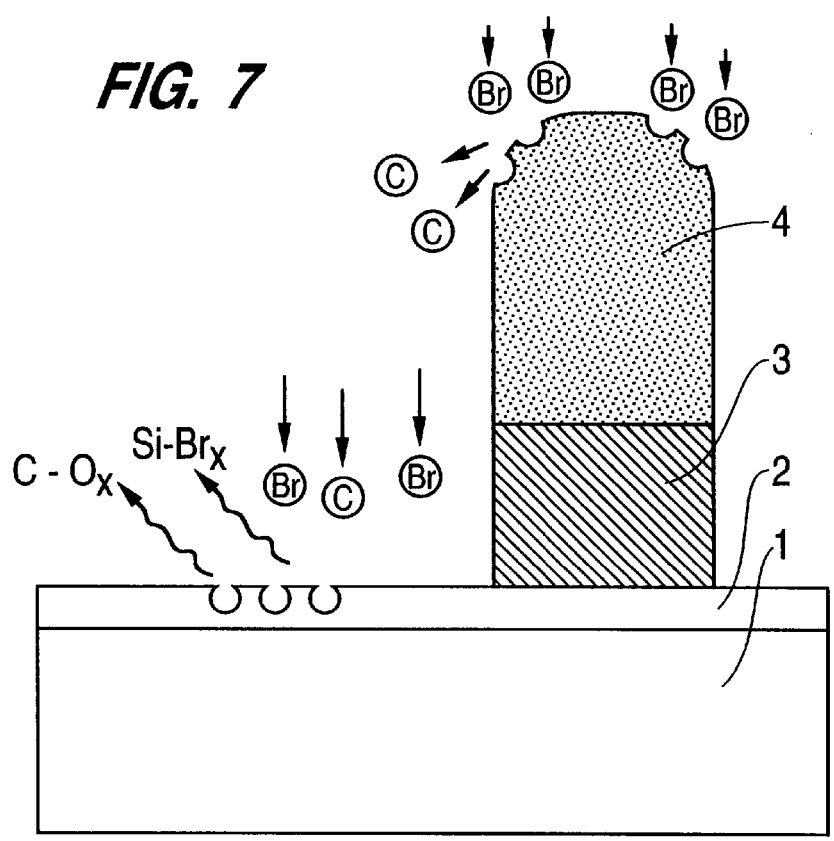
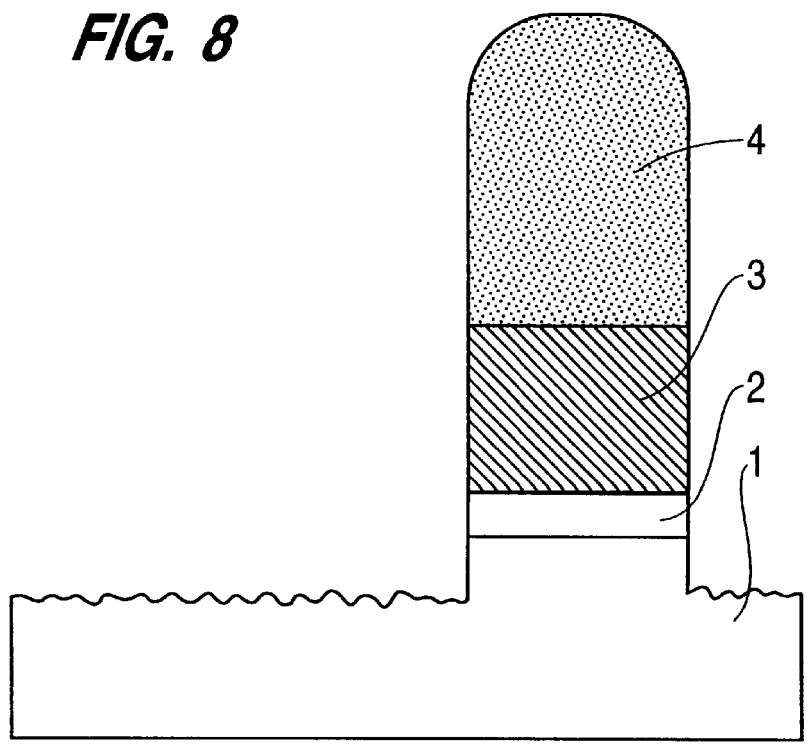

METHOD OF ETCHING POLYSILICON LAYER

BACKGROUND OF THE INVENTION

The present invention relates to a method of etching polysilicon layer used in a semiconductor integrated circuit (IC) and others.

The higher integration and performance have been progressed in the ICs recently. One of these technology trends is to develop a Metal-Oxide-Silicon (MOS) transistor of which components including wiring are designed as small as in a submicron unit. Under a design rule of such a MOS transistor employing a submicron unit, a thickness of silicon dioxide film, which comprises a gate insulating layer, is as thin as not more than 20 nm. Accordingly, in an etching process of the polysilicon layer, it is crucial to obtain a selectivity between polysilicon layer and silicon dioxide layer which is an underlayer of polysilicon layer. (Selectivity: an etching speed ratio of polysilicon layer vs. silicon dioxide layer)

FIG. 7 illustrates a conventional etching method of the polysilicon layer. A sample to be etched comprises as follows: A silicon dioxide layer 2 is formed on a silicon substrate 1, and a polysilicon layer 3 is formed thereon, further a resist layer 4, a mask, is formed on the polysilicon layer 3. For etching the polysilicon layer 3, chlorine system gas, bromine system gas or mixed gas of them is used.

When the silicon dioxide layer 2 is exposed in the polysilicon layer 2 during the etching process, the silicon dioxide layer 2 starts being etched by carbon emitted from the resist layer 4 following the reaction formula below:

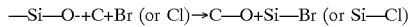

Through the above conventional method, since carbon is emitted from the resist layer 4, it is very difficult to heighten the selectivity. In particular as shown in FIG. 8, when the silicon dioxide layer 2 becomes thinner, the etching progresses as far as into the silicon substrate 1. Therefore, it has been difficult to obtain high reliability in IC circuitry, and it still remains as an issue.

SUMMARY OF THE INVENTION

The present invention provides a method of etching polysilicon layer, through this method, highly reliable IC circuitry can be produced.

The etching method of the present invention comprises two processes: one is to form mask layer including carbon on polysilicon layer which is formed on silicon dioxide film on a silicon substrate, the other process is to etch polysilicon layer while depositing oxide silicon layer onto mask layer.

According to the etching method of the present invention, silicon oxide layer is depositing around the mask layer at the same time when polysilicon layer is etched, thereby carbon emission out of the mask layer is restrained. The selectivity between the etching speeds of polysilicon layer vs. dioxide silicon layer can be thus substantially heightened. As a result, the etching method of the present invention can greatly improve the reliability of MOS transistor having a thin silicon dioxide layer as a gate insulating film because nothing other than polysilicon layer is etched.

BRIEF DESCRIPTION OF THE DRAWINGS

FIG. 7 is a cross section of a sample used in the etching process of polysilicon layer in the conventional method.

FIG. 8 is a cross section of the etched sample in the conventional method.

DESCRIPTION OF THE PREFERRED EMBODIMENTS

Embodiment 1

Figure 1:
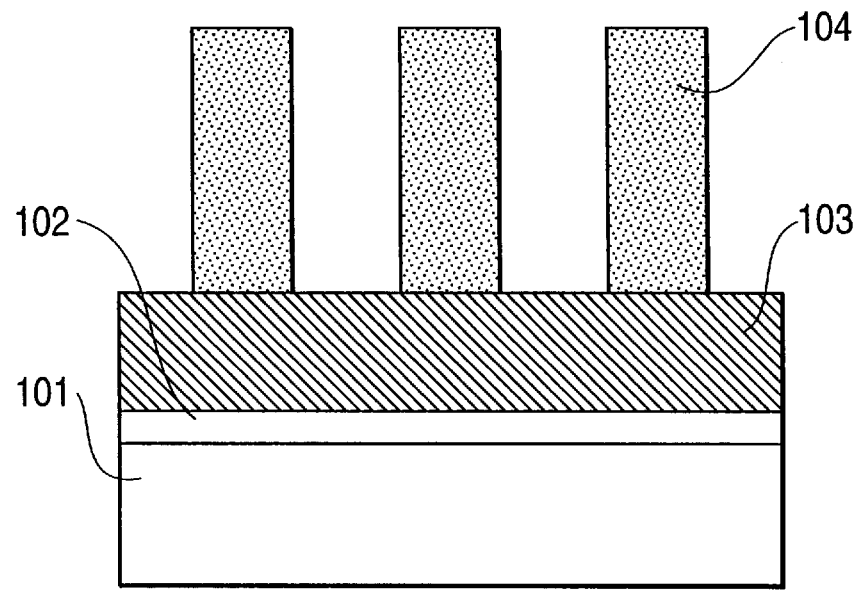
FIG. 1 is a cross section of a sample to be etched in the embodiment 1.

A sample in FIG. 1 is produced through conventional thin-film forming technique. First, silicon dioxide film 102 having 20 nm thickness is grown on a silicon substrate 101, and polysilicon layer 103 having 200 nm thickness is deposited on the silicon dioxide layer 102. After the above processes, line pattern is formed with resist layer 104 comprising resin.

Figure 2:
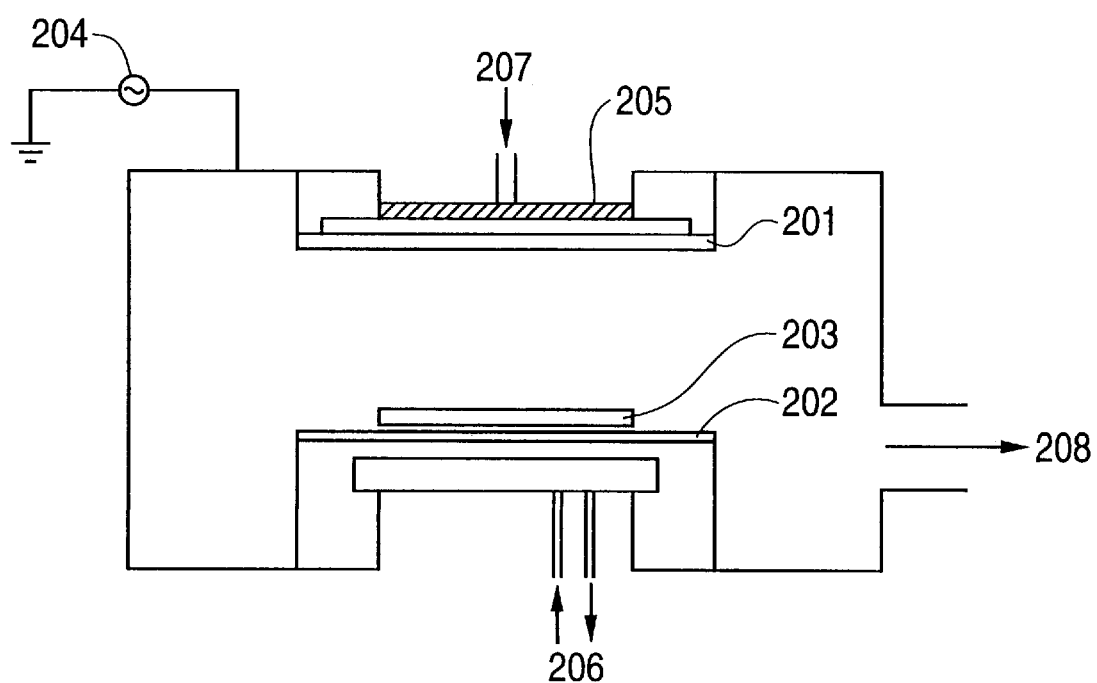
FIG. 2 is a rough cross section of an etching apparatus used in the embodiment 1.

Second, the above sample is etched by using an etching apparatus shown in FIG. 2, having parallel-plate electrodes. The etching process is this: A piece of wafer 203, the sample to be etched, is disposed on a lower electrode 202. Apply power to an upper electrode 201 from a high voltage power supply 204, and keep a temperature of the upper electrode 201 higher than that of the wafer 203, then flow mixed gas of HBr gas and oxygen gas at the same time when etching is progressed under the condition below: frequency of the high voltage power supply is 13.56 MHz, and the applied power is 300 W, the temperature of the upper electrode 201 is adjusted at 100° C. by a heater 205 so that the temperature can be kept higher by 40° C. than 60° C. which is the temperature of the wafer 203. The temperature of wafer 203 is preadjusted at 60° C. by water 206 running under the lower electrode 202. The mixed gas of HBr gas and oxygen gas inflows from a gas inlet 207 into the etching apparatus, and discharges out of an exhaust hole 208. A gas pressure is 25 Pa, a flow rate of HBr gas is 80 sccm, and that of oxygen gas is 2 sccm.

Figure 3:
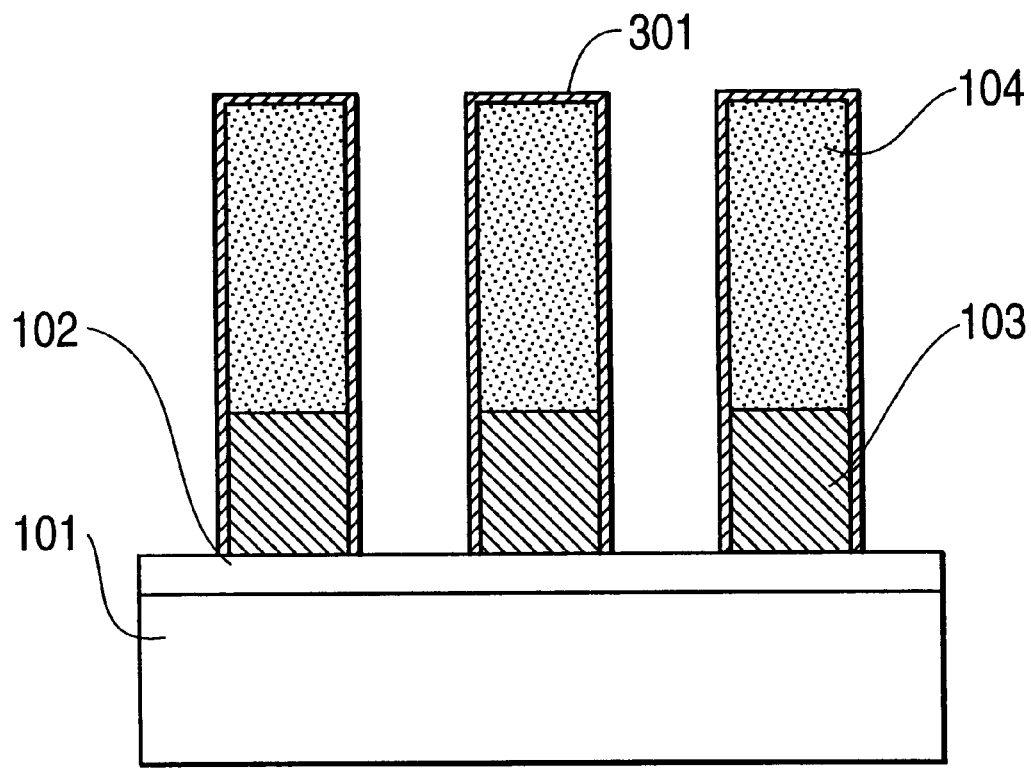
FIG. 3 is a cross section of the etched sample in the embodiment 1.

Through this etching method, a substantially fine wafer is obtained because the silicon dioxide layer 102 is not etched but only a specific area of the polysilicon layer 103 is etched. After this etching process, as illustrated in FIG. 3, the silicon oxide layer 301 is deposited on the surface of resist layer 104. The deposition of silicon oxide layer 301 is progressed by this process: First, polysilicon layer 103 reacts with HBr gas to produce Si—Brx. Second, the Si—Brx reacts with the oxygen in the mixed gas to produce silicon oxide, and the silicon oxide is deposited on the surface of resist layer 104. This silicon oxide layer 301 prevents carbon from emitting out of the resist layer 104, and thereby the wafer being finely etched can be produced.

The inventors found out the preferred etching conditions after experimenting on various cases.

One of the conditions is this: In order to deposit the silicon oxide layer 301 around the resist layer 104 adequately, a temperature of at least one part of inside wall of the etching apparatus, e.g. the upper electrode 201 or a side wall of the inside wall, should be kept higher than the wafer temperature by over 30° C.; however, the temperature difference therebetween should not be too much. Since the maximum operable temperature of the inside wall is 200° C., a temperature of at least one part of the inside wall should be specified not more than 200° C. When the lowest possible temperature of the wafer is set at −10° C., the temperature difference between them should be kept within 210° C. Among other conditions, when the wafer temperature is set between 30° C. and 70° C. and the temperature difference between the upper electrode and the wafer is kept between 30° C. and 50° C., the best etching performance can be obtained.

Figure 4:
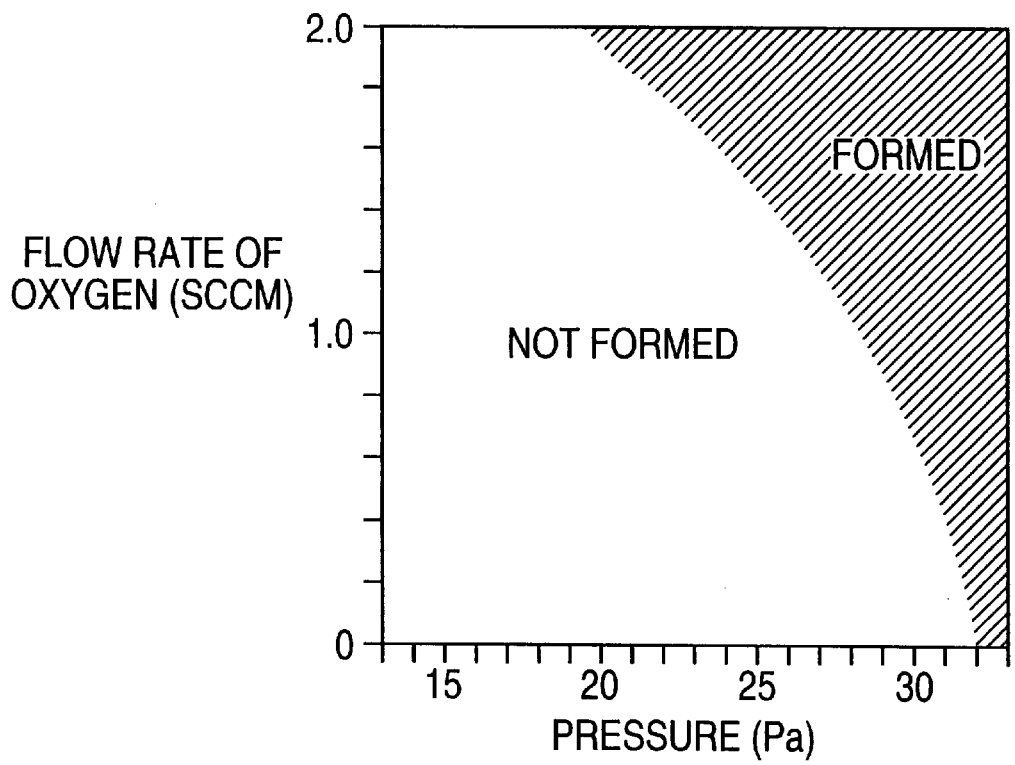
FIG. 4 illustrates how a gas inflow condition influences the depositing of the silicon oxide layer around the resist layer.

Another preferred etching condition relates to an etching gas pressure and a flow rate of oxygen gas. FIG. 4 illustrates whether the silicon oxide layer 301 is deposited or not according to the changes of the gas pressure and oxygen gas flow-rate in the above embodiment. FIG. 4 tells that the more flow-rate and higher gas pressure increase the deposition of silicon oxide layer 301 around the resist layer 104. When the gas pressure exceeds 31 Pa, the silicon oxide layer 301 is deposited even without oxygen gas because oxygen is supplied from the silicon dioxide layer 102. Therefore, a preferable flow rate of oxygen gas is not less than 0.1 sccm, that is, oxygen gas is preferably included in the mixed gas about more than 1 volume %. On the other hand, when the flow rate of oxygen gas exceeds 20 sccm, or the mixed gas includes more than 20 volume % of oxygen gas, a layer thickness of the silicon oxide layer 301 grows unnecessarily thick. The oxygen gas volume is thus preferred between 0.1 and 20 volume %. When the oxygen volume stays between 1 volume % and 6 volume % in particular, the best etching performance can be obtained.

Figure 5:
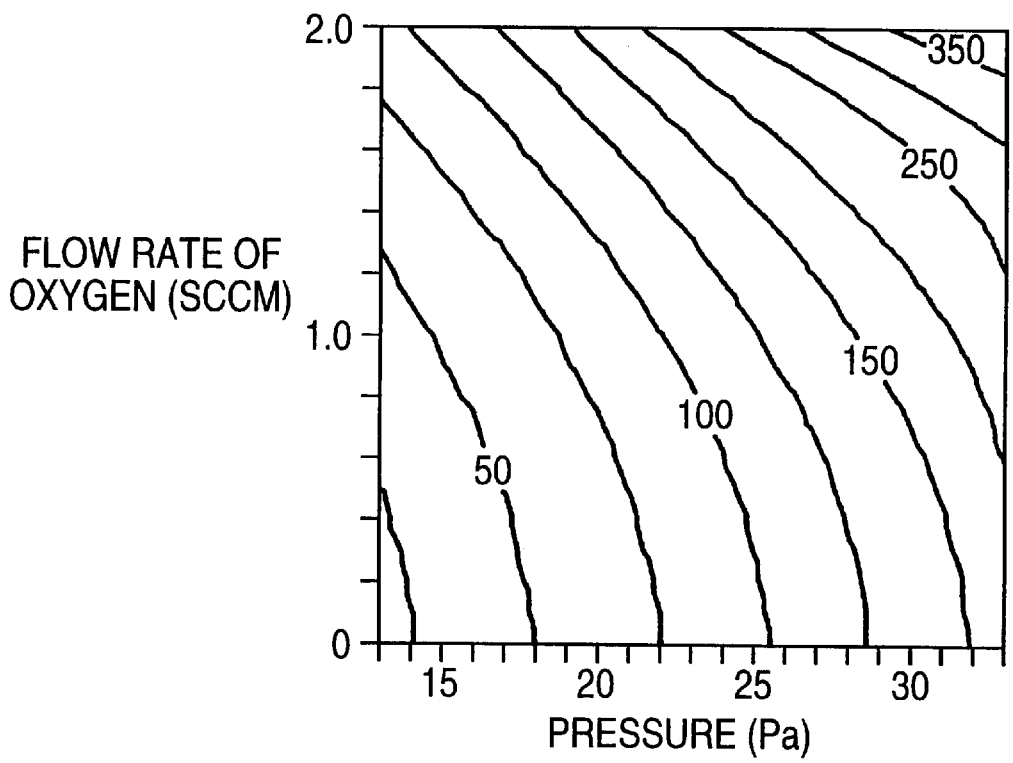
FIG. 5 illustrates a relation between the inflow condition of gas and the selectivity of silicon dioxide layer vs. polysilicon layer.
Figure 6A:
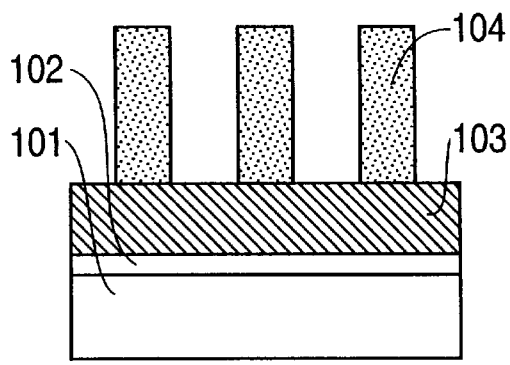
FIG. 6 shows cross sections of a sample used in the etching process of polysilicon layer in the embodiment 2.
Figure 6B:
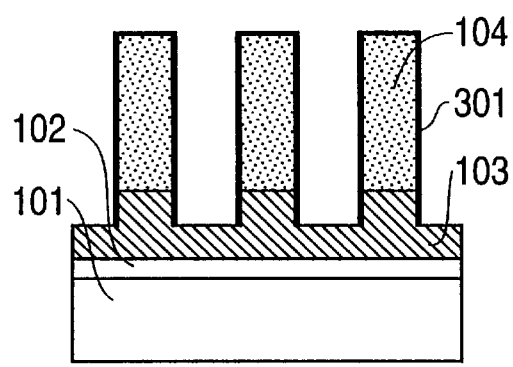
Figure 6C:
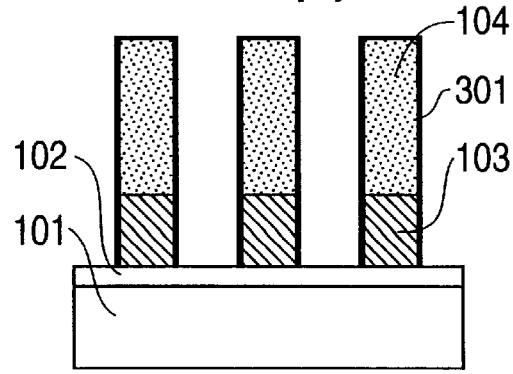
Figure 6D:
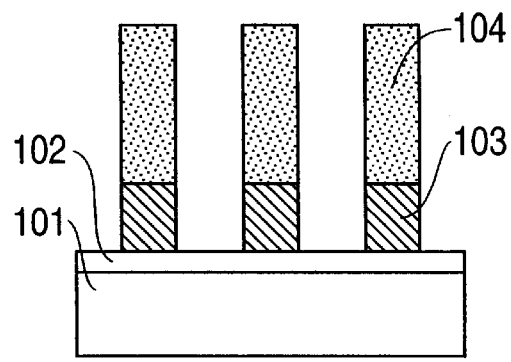
Figure 6E:
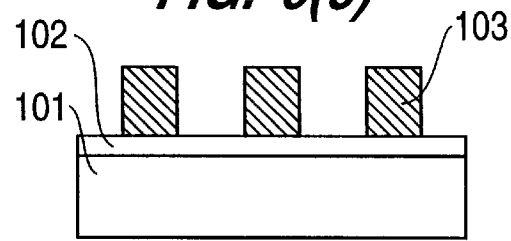

FIG. 5 shows how the selectivity changes in response to the changes of gas pressure and oxygen gas flow-rate. FIG. 5 tells that the more flow-rate and higher gas pressure increase the selectivity, a ratio of etching speeds of polysilicon layer 103 vs. silicon dioxide layer 102. When the selectivity exceeds 150 in particular, or the etching speed of polysilicon layer 103 is faster than that of silicon dioxide layer 102 by over 150 times, a fine etching performance can be obtained. The etching condition of selectivity not less than 150 is thus preferable. In comparing with FIG. 4, the phenomenon of this increasing selectivity in response to the increases of gas pressure and oxygen gas flow-rate can be caused by the deposition of silicon oxide layer 301 on the resist layer 104 during the etching. When the gas pressure is 33 Pa and oxygen gas flow-rate is 3 sccm, silicon oxide layer starts being deposited on the silicon dioxide layer 102, thereby the silicon dioxide layer 102 is hardly etched. In other words, since the etching speed of silicon dioxide layer 102 becomes close to zero, the selectivity becomes close to infinity, thus a fine etching result can be obtained.

Embodiment 2

FIG. 6 illustrates Embodiment 2.

First, as step (a) shows, the silicon dioxide layer 102 having 20 nm thickness is grown on the surface of silicon substrate 101, then polysilicon layer 103 having 200 nm thickness is deposited thereon, finally line pattern is formed with the resist layer 104 on the polysilicon layer 103. A sample to be etched is thus produced. This is the same process as described in the embodiment 1. Etching is conducted on the polysilicon layer 103 by using the etching apparatus shown in FIG. 2 under the following etching condition: Applied high voltage power=300 W, Gas pressure=33 Pa, HBr gas flow rate=80 sccm, Oxygen gas flow rate=2 sccm, Process time=190 seconds, Wafer temperature=60° C., Upper electrode temperature=100 ° C. As shown in step (b), the silicon oxide layer 301 starts depositing around the resist layer 104 at the same time when the polysilicon layer 103 starts being etched. The selectivity at this time records a very high rate 370. The deposition of silicon oxide layer 301 prevents carbon from emitting out of the resist layer 104. As the step (c) shows, the etching of polysilicon layer 103 ends.

As step (d) shows, following the etching step, the silicon oxide layer 301 is removed in the etching apparatus without taking out the etched wafer from the apparatus. The etching condition for removing the silicon oxide layer 301 is this: applied high voltage power=250 W, Gas pressure=20 Pa, HCl gas flow-rate=40 sccm, CF4 gas flow-rate=20 sccm, Process time=8 seconds. Finally, as shown in step (e), the wafer is moved into an ashing apparatus to remove the resist layer 104 by plasma oxygen process. The condition of plasma oxygen process is this: Applied high voltage power=1 kW, Pressure=130 Pa, Oxygen gas flow-rate=600 sccm, and Process time=60 minutes.

As described above, the etching of polysilicon layer 103 and removing of the silicon oxide layer 301 are done in sequence, thereby deposited silicon oxide in the etching apparatus can be also removed. As a result particles in the etching apparatus are drastically reduced, for the deposition of silicon oxide causes to generate particles. The resist layer 104 covered with the silicon oxide layer 301 cannot be removed through plasma oxygen process; however, since the silicon oxide layer 301 around the resist layer 104 has been removed, the resist layer 104 can be completely removed with ease.

In a same experience as the embodiment 2, wafers during and after the etching of polysilicon layer 103 are taken out in order to examine a layer thickness of silicon oxide layer 301 deposited on the resist layer 104 by using a scanning electron microscope. The result shows that the layer thickness of silicon oxide layer 301 grows as this:

10 seconds after starting etching: about 1 nm in thickness, 50 seconds after starting etching: about 5 nm in thickness, End the etching or 190 seconds after starting etching: about 20 nm in thickness Accordingly, the silicon oxide layer 301 starts depositing right after the etching begins, and the carbon emission from the resist layer 104 is restrained. The lowest limit of layer thickness of silicon oxide layer 301, above which a restraint effect is obtained, is not always identified, but it seems 1 nm based on the experiment. The upper limit, below which the restraint effect is obtained, is not specified from the view point of the restraint effect of carbon emission. However, if the layer thickness at the end of etching would be too thick, it takes time for removing, and the polysilicon layer 103 of the specified dimension cannot be obtained. The layer thickness at the end of etching is thus preferably not more than 50 nm.

In the above embodiments 1 and 2, during the etching process, oxygen gas is added to etching gas in order to deposit the silicon oxide layer 301 around the resist layer 104. Other than the above methods may be used as far as the silicon oxide layer 301 deposits around the resist layer 104. HCl gas or Chlorine gas can be used instead of HBr gas as etching gas. Bromine system gas including Br, Chlorine system gas including Cl, or mixed gas of Bromine system gas and Chlorine system gas may be used. Other than resist material comprising resin, such as mask material including carbon may be used.

The present invention is not limited to the above embodiments but can be varied in many ways. For example, the embodiments above describe MOS transistors; however, these embodiments can be applied to other devices comprising silicon. Therefore, variations within spirit and scope of the present invention are included in the scope of the claims attached.

What is claimed is:

1. A method of etching a polysilicon layer comprising the steps of:

forming a polysilicon layer on a silicon dioxide layer formed on a silicon substrate;

forming a mask layer on said polysilicon layer, said mask layer comprising carbon, and etching said polysilicon layer by using said mask layer as a mask, mask, wherein said etching step comprises the steps of:

using a mixed gas of an etching gas and an oxygen gas;

controlling a flow rate of said oxygen gas and a gas pressure of said mixed gas;

producing a first product material containing silicon by a reaction of said polysilicon layer and said etching gas; and etching said polysilicon layer while depositing a product layer of a second product material containing silicon and oxygen on a surface of said mask layer, said second product material being produced by said first product material and said oxygen gas.

2. The method of claim 1, wherein said etching gas is at least one of a Bromine system gas or a Chlorine system gas.

3. The method of claim 1, wherein a resist layer comprising resin is used as said mask layer.

4. The method of claim 1, further comprising the step of removing said product layer without removing said silicon substrate from an etching apparatus.

5. The method of claim 1, wherein said second product material comprises a silicon oxide.

6. The method of claim 1, wherein an amount of said oxygen gas of said mixed gas is controlled in a range of 0.1 to 20% by volume.

7. The method of claim 6, wherein said amount of said oxygen gas of said mixed gas is in a range of 1 to 6% by volume.

8. The method of claim 1, wherein said etching step is conducted in an etching apparatus comprising an inside wall, at least a part of said inside wall having a temperature higher than that of said silicon substrate.

9. The method of claim 8, wherein a temperature difference between said at least a part of said inside wall and said silicon substrate is in a range of 30 to 210° C.

10. The method of claim 9, wherein said temperature difference is in a range of 30 to 50° C.

* * * * *